United States Patent
Reul

(10) Patent No.: US 6,461,188 B2
(45) Date of Patent: Oct. 8, 2002

(54) SOLDERABLE ELECTRICAL CONNECTION ELEMENT WITH A SOLDER DEPOSIT

(75) Inventor: Bernhard Reul, Allemagne (DE)

(73) Assignee: Saint-Gobain Glass France (FR)

( * ) Notice: Subject to any disclaimer, the term of this patent is extended or adjusted under 35 U.S.C. 154(b) by 0 days.

(21) Appl. No.: 09/867,819

(22) Filed: May 31, 2001

(65) Prior Publication Data

US 2002/0001997 A1 Jan. 3, 2002

(30) Foreign Application Priority Data

Jun. 2, 2000 (DE) .......................................... 100 27 582
Sep. 20, 2000 (DE) .......................................... 100 46 489

(51) Int. Cl.[7] .............................. H01R 4/24; H01R 4/26; H01R 11/20; H01R 4/02
(52) U.S. Cl. ........................................ 439/422; 439/876
(58) Field of Search ................................. 439/422, 424, 439/877, 259, 260, 83, 874, 876, 329, 77, 879

(56) References Cited

U.S. PATENT DOCUMENTS

| | | | | |
|---|---|---|---|---|
| 3,697,925 A | * | 10/1972 | Henschen .................... | 439/422 |
| 3,715,457 A | * | 2/1973 | Teagno et al. .......... | 174/117 FF |
| 3,924,917 A | * | 12/1975 | Munshower .............. | 174/84 C |
| 3,960,430 A | * | 6/1976 | Bunnell et al. ................ | 174/48 |
| 4,066,319 A | * | 1/1978 | Baker et al. ................. | 439/422 |
| 4,082,402 A | * | 4/1978 | Kinkaid et al. ............. | 439/422 |
| 6,319,829 B1 | * | 11/2001 | Pasco et al. ................ | 257/700 |

FOREIGN PATENT DOCUMENTS

| | | |
|---|---|---|
| DE | 4304786 | 8/1994 |
| DE | 19536131 | 9/1995 |

* cited by examiner

Primary Examiner—Khiem Nguyen
Assistant Examiner—Chandrika Prasad
(74) Attorney, Agent, or Firm—Pennie & Edmonds LLP

(57) ABSTRACT

According to the invention, a metal insertion piece (6) is provided in a solderable electrical connection element (1) with a thin support sheet (2), at least one metal conductor (3) and at least one free contact face (5), which may be joined to an associated connection face (11) of another component (12), by means of a soldered joint that can be made using a solder deposit (9), which metal insertion piece (6) passes through the connection element (1) and the support sheet (2) respectively in the region of the contact face (5) and is securely joined to this support sheet, which serves as a base for the solder deposit (9). Preferably, the insertion pieces (6) may be derived from conventional crimp attachments. They may also be used for mechanically fastening both the solder deposit (9) and an electrical conductor to the support sheet (2).

19 Claims, 1 Drawing Sheet

SOLDERABLE ELECTRICAL CONNECTION ELEMENT WITH A SOLDER DEPOSIT

FIELD OF THE INVENTION

The invention relates to a solderable electrical connection element having the characteristics of the preamble of Claim 1, that is, a solderable electrical connection element, comprising a thin support sheet and at least one metal conductor having at least one contact face which is provided with a solder deposit and which can be joined by soldering this solder deposit to a connection face of another component with which it is associated, characterized in that an insertion piece provided with the solder deposit and passing through the connection element is securely joined to the support sheet in the region of the contact face.

BACKGROUND OF THE INVENTION

Document DE-C1-195 36 131 discloses a solderable connection element for antenna panes, in which several free contact faces and the associated conducting tracks, which are insulated from one another, are joined to a heat-resistant non-conducting support sheet, an upper sheet layer extending over the contact faces and the soldering points, respectively. The ends of conductors and the free contact faces, respectively, to be soldered are provided with solder deposits soldered to their lower or connection side. These solder deposits are remelted by supplying heat at the place where the actual welded joint is produced and they are durably joined to an associated connection face by pressing them onto the latter. Not provided here is a separating piece intended to ensure a reproducible thickness of the solder layer. At the present time, a system based, at great expense, on delivering a finely metered quantity of solder and on precisely tailored soldering tools and methods, is used so that, during pressing after melting, the soldered joint is formed with a sufficiently uniform thickness and surface distribution.

During the soldering of such connection elements in industrial mass production, only a few seconds are available for each soldering operation, during which the necessary heat must be transmitted through the support sheet to the pretinned contact faces. To optimize heat transfer in the presence of strong temperature attenuation, it is necessary to ensure that the heat supply is as extensive as possible by means of special tools. Likewise, the temperature of the tool must be well above the melting point of the solder. It is again for this reason that the support sheet must be made of a heat-resistant material (usually, polyimide or Kapton), which are very expensive materials compared with other plastics, although its heat resistance is only actually necessary over a small fraction of its total surface area.

Another problem is the reliability of the contact, which can only be checked at great expense, after making the soldered joint, for example by X-ray examination.

In the prior art, the contact zone is provided, on its side facing the corresponding connection area on the pane, with at least one narrow adhesive tape, which extends in a straight line as far as the conducting tracks with a relatively small width. Thus, the connection element may be positioned and temporarily fastened to the window pane. Moreover, the adhesive tape serves to relieve the tensile force in the actual contact zone; if necessary, the tape can also go completely around the contact zone in a ring and thus very extensively protect it from environmental effects (moisture, soiling).

Document DE-C2-43 04 788 discloses a prefabricated laminated component consisting of a thin metal strip and of an insulating sheath, composed of thin layers of plastic sheets, which surrounds the strip. This connection element, also called a flat conductor is provided locally with coaxial holes in the two layers of the insulating sheath and of the metal layer, which holes form a contact window. Into the latter may be introduced molten solder, by means of which the metal strip is securely connected to an electrical conductor installed, for example, on a pane. This construction of a contact window also allows, by serving as an observation window, simple visual inspection of the soldering point. This connection element may also be adhesively bonded to the surface of the pane.

Finally, it is known to provide crimp connectors on such flat conductors, for example, on the one hand, to securely fasten an end plug or electrical switching elements to the conducting tracks and, on the other hand, to electrically connect it (them) to these conducting tracks with a sufficient cross section. A metal insertion piece, with a cross section substantially in the form of a U and with branches at the toothed free ends, is placed on the sheet. The teeth are pressed or forced by means of a suitable manual or mechanical tool through the sheet and, in the manner of a knife contact, through the conducting track and are then turned up laterally, thus producing a joint which is formed by mechanical interlocking and is, furthermore, electrically conducting. In general, incorporated into the abovementioned plastically deformable U-shaped region are contact tabs or bars, or other soldering faces.

SUMMARY OF THE INVENTION

It is an object of the invention to provide another solution for forming solder deposits on solderable electrical connection elements of the type mentioned in the introduction.

In accordance with the invention, this objective is achieved by the characteristics of Claim 1: that is, a solderable electrical connection element, comprising a thin support sheet and at least one metal conductor having at least one contact face which is provided with a solder deposit and which can be joined by soldering this solder deposit to a connection face of another component with which it is associated, characterized in that an insertion piece provided with the solder deposit and passing through the connection element is securely joined to the support sheet in the region of the contact face. The characteristics of the secondary claims provide advantageous improvements of this object. Claim 11 presents, by way of preferred use of at least one connection element according to the invention, that for a window pane, with improvements described in secondary claims 12 and 13.

If the region of the contact point to be furnished with a solder deposit is provided with a metal insertion piece, securely joined to the support sheet and passing through it, this piece thus forms in several regards a better base for the formation of the solder deposit. For example, it is no longer necessary to heat the connection element itself, or alternatively its support sheet, whether the solder deposit is formed, according to a first variant, by soldering a quantity of solder to the insertion piece or whether, according to a second variant, it is fastened only by mechanical interlocking to the support sheet at the same time as the insertion piece.

Particularly preferably, it is necessary to provide a direct contact, or alternatively a direct connection, of the solder deposit with the contact face of the connection element so as to prevent the occurrence of multiple transition resistances. It is not necessarily essential to bring the metal of the insertion piece directly into contact with the conducting track or with the stripped end of the cable. The contact face is soldered directly to the corresponding connection face of the component to be electrically contacted, for example an antenna pane or a heating pane.

However, optionally, there is also the variant consisting in putting the insertion piece into electrical contact with the respective conductor, while the solder deposit is connected directly only to the insertion piece and later, of course, to the respective corresponding connection face. In such a case, that part of the insertion piece which is provided with the solder deposit directly forms the contact face of the respective conductor.

The electrical conductor may have the shape of a conducting track joined flat to the support sheet or embedded in the latter and/or also of a cable joined at least mechanically to the support sheet. In the latter case, the contact face is opportunely formed by removing the insulation at the end of the cable. In this way, several cables brought in individually may also, particularly advantageously, be maintained in a predetermined spatial arrangement by very simple means on the support sheet of the connection element.

It goes without saying that various configurations of electrical conductors and of their contact faces may also be combined or brought together on a single support sheet. Thus, for example, additional conductors (cables) may, where required, also be placed on a connection element which is normally equipped with a predetermined number of conducting tracks. The individual conductors will, in principle, be insulated from one another. However, it is also possible to bring, as an addition, a cable to be connected into electrical contact at the same time with an existing conducting track and with the associated corresponding connection face, if a corresponding need were to arise.

In a preferred embodiment, the insertion pieces are, before they are joined to the connection element, configured so as to have a cross section approximately in the form of a U with free ends of the toothed branches whose teeth are pressed or forced through the connection element and then turned up laterally by plastic deformation. Of course, it is also possible to imagine other shapes of insertion pieces. However, the preferred shape here promises the best results in terms of possible mechanical processing and its good cost-effectiveness.

As an additional advantage, the insertion piece allows markedly better heat supply to the solder deposit during the subsequent soldering of the contact face to the corresponding connection face. Since the insertion piece passes through the connection element, one of its sides remains free after the placing of the contact face, or the solder deposit, on the base and can be used for supplying heat to the actual soldering point.

Given that metals conduct heat much better than plastics, this results in markedly improved heat transfer from the soldering tool to the solder deposit. Where appropriate, it is possible to switch from supplying heat flat to soldering irons, to a laser and the like. The time required for the soldering operation is significantly reduced. The temperature of the tool can be lowered. Furthermore, a less heat-resistant and consequently less expensive plastic may possibly be used as the support sheet. Finally, the thermal load around the soldering points decreases.

Yet another advantage of the metal insertion piece is its spacer role. The minor drawback of a greater thickness with respect to the contact zone of the known flat-cable connection element is advantageously more than compensated for by the fact that the insertion piece, or its turned-up teeth, are kept permanently at a predetermined height above the contact face. The space created here can be filled with the solder deposit with sufficient reliability and is at the same time firmly bounded so that normal application during melting can no longer cause lateral expulsion of the solder material. Thus, an improvement in the quality of the soldered joints may also be expected. Another consequence of the increased certainty of preventing lateral expulsion of the solder is that the distances between neighbouring contact faces can be made smaller than in the prior art, because the risk of short circuits by expelled solder is considerably reduced.

Yet another advantage over forming solder deposits directly on the conducting tracks is the intrinsic mechanical rigidity of the insertion pieces. If a force is exerted on the connection element, the soldered joints produced with insertion pieces are more difficult to break than those not having insertion pieces, so that it is possible to dispense with the additional security provided by adhesive tapes or the like.

Likewise, according to an improvement and, as in the prior art, adhesively-bonded joints may also be provided in the contact zone between the connection element according to the invention and the other component, for example in order to protect the soldering point from the effect of moisture or of soiling.

Despite their slightly greater thickness in the contact zone, the connection elements according to the invention can be used not only on free surfaces of monolithic window panes, but also on window surfaces which lie within laminated panes. The adhesive films normally used in laminations are again much thicker than the contact zones and can encapsulate them without any difficulty.

The application of the connection elements described here is not, however, limited to the electrical connecting of window panes.

Overall, and whatever the envisaged use, the fitting of connection elements with the insertion pieces, coupled to the formation of the solder deposit, can be mechanized to a great extent, just like the manufacture of the actual soldered joint, using the spacer function of the insertion pieces.

Further details and advantages of the subject of the invention will become apparent from the drawing of preferred illustrative examples and from the detailed description thereof which is given below.

BRIEF DESCRIPTION OF THE DRAWINGS

In the simplified and greatly enlarged representation.

DESCRIPTION OF PREFERRED EMBODIMENTS

Figure 1:
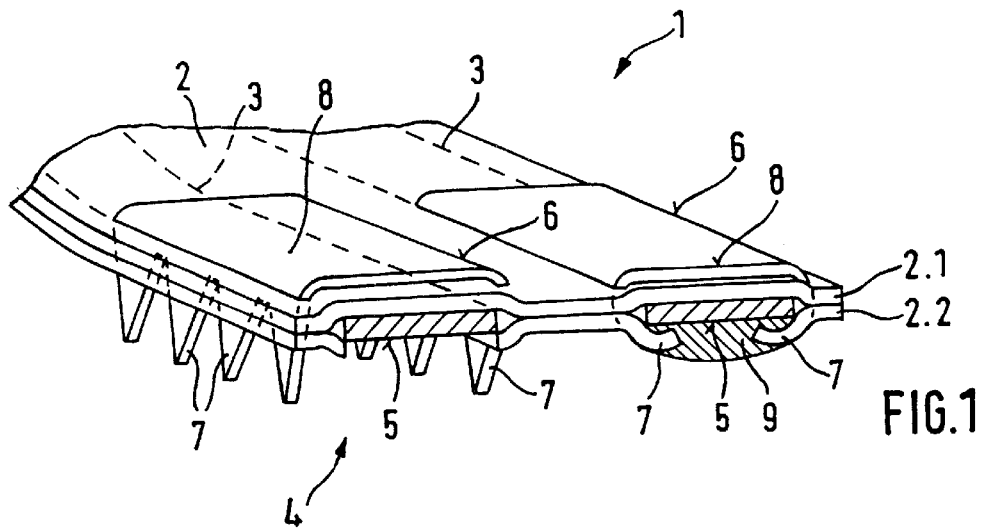
FIG. 1 is a perspective view of a bipolar contact zone furnished with insertion pieces with two successive steps for fastening the insertion pieces, in which a solder deposit is soldered to the insertion piece itself.

According to FIG. 1, a connection element 1 is composed of a laminated support sheet 2, comprising an upper layer 2.1 and a lower layer 2.2, between which layers are housed two parallel metal strips constituting conducting tracks 3 electrically insulated from each other. In a contact zone 4, the conducting tracks 3 are stripped by locally removing the lower layer 2.2 of the support sheet, so that it is possible to place contact faces 5 at this point. Insertion pieces 6 are provided in the same contact zone, these pieces being made in the form of crimps, initially with a U-shaped cross section with branches having toothed ends.

The two parallel rows of teeth 7 of the insertion pieces 6 are firstly crossed through the support sheet 2, in such a way that the support sheet 2 is entirely penetrated on either side of each conducting track 3 (left side), and then are turned up laterally towards one another by means of a suitable tool (right side). They could also penetrate or touch the conducting tracks themselves. However, this is not necessary from the functional standpoint because, unlike in conventional crimp connections, there is no need for direct electrical contact between the insertion piece and the conducting track. The pressing direction is oriented in such a way that the teeth 7 emerge on the contact zone side and are turned up towards the respective contact face 5. Consequently, the latter is firmly enveloped by the respective insertion piece 6 between the turned-up teeth 7 of the latter, the branches and the core 8 of the initial U-shaped cross section. The core 8 is placed, with a free outer face, on the surface of the upper layer 2.1 of the support sheet 2 lying opposite the contact faces 5. This is also usually different in standard crimp connections—if the teeth do not themselves penetrate the conducting track, the core there is pressed more or less flat against a stripped portion of the respective conducting track in order to ensure as good a flow of the current as possible.

The length of the teeth 7 of the insertion pieces 6 must be tailored to the requirements. For standard crimp attachments, they are longer than in this representation. The tips of the teeth may overlap after they have been turned up, looking in the longitudinal direction of the conducting track. In such a case, it may be advantageous for the two rows of teeth to be offset one with respect to the other in the longitudinal direction.

In a subsequent step, a solder deposit 9 is now formed, after the teeth 7 have been turned up, on the toothed side of the insertion piece 6 in such a way that the solder wets not only the teeth 7 but also the contact face 5. The quantity of solder used is large enough to rise again above the teeth 7 slightly. This ensures that the melted solder makes a direct electrical contact between the contact face 5 and a connection face associated with the latter. (See FIG. 3).

With regard to the actual dimensions of these components, it should be pointed out that the conducting tracks have, in a given embodiment, a width of about 1.5 mm and a thickness of about 0.1 mm, whereas the length of the insertion pieces 6, which are formed by portions of metal sheet about 0.2 mm in thickness, is about 3 to 5 mm. The teeth must, of course, be long enough to pass through the support sheet and still be able to be bent up.

Figure 2:
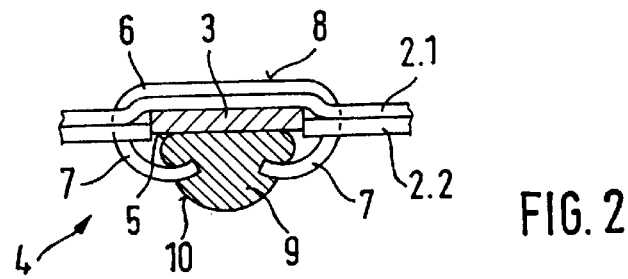
FIG. 2 shows a second embodiment, in which the solder deposit is cold-pressed onto the contact face of a unipolar contact zone, by means of the insertion piece.

FIG. 2 shows another variant of the solder deposit 9, in which a length of soft solder wire 10 is again jammed, cold, by means of a suitable tool, between the turned-up teeth 7 of the insertion piece 6 in such a way that, on the one hand, it touches the contact face 5 and, on the other hand, it again rises slightly above the teeth 7. This variant has the advantage that the contact zone 4 does not have to be already heated during the formation of the deposit. In a known manner, the solder wire may, unlike in the representation, have a tubular cross section and be combined with a strand of flux located inside it, which facilitates the subsequent soldering.

Figure 3:
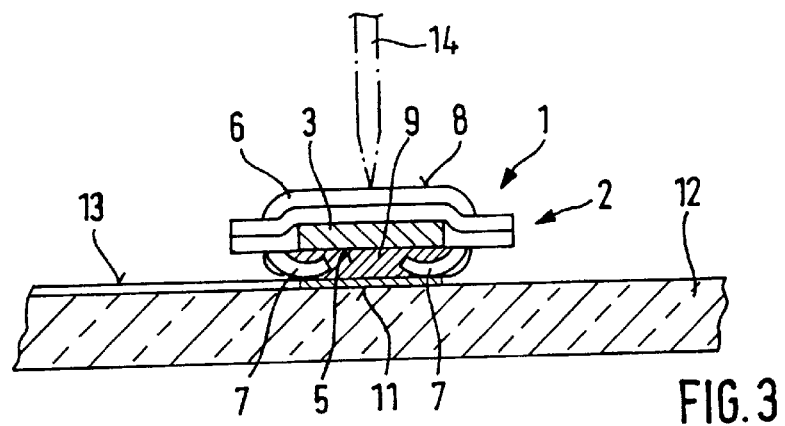
FIG. 3 is a cross-sectional representation of a terminated soldered unipolar contact zone between the connection element and a window pane provided with a corresponding connection face.

FIG. 3 shows, by way of a preferred application, sketched in a simplified manner, in the case of the connection element described here, a terminated soldered joint between an individual contact face 5 and a connection face 11 which is joined to it. This connection face is provided on a window pane 12 made of glass or plastic and is connected, for example, to antenna elements or heating elements 13, which are only indicated here. The connection face 11 may, in a known manner, just like the electrical elements which follow it, be advantageously manufactured from a conducting silver paste deposited by screen printing and fired. If necessary, it may also be pretinned.

FIG. 3 shows the instant of complete melting of the solder deposit 9 under the insertion piece 6, against the core of which the tip of a soldering tool 14, indicated only by dot/dash lines, is still applied. Obviously, the heat is transferred from the soldering tool 14 to the actual soldering point essentially via the material of the metal insertion piece 6, which is, however, substantially more rapid than the current soldering through the upper layer 2.1 of the sheet. At the same time, its turned-up teeth 7 form a spacer between the lower side of the connection element in the contact zone and the upper side of the window pane 12, or the connection face 11, against which they are applied. This thus ensures a defined thickness of the solder within narrow limits. However, the solder can still flow laterally, during melting, through the slots between the teeth 7 and thus enlarge the base of the soldered joint with respect to the distance between the tips of the teeth.

Instead of using a tool 14, heat may be supplied without any contact, by radiation (for example laser radiation), the application pressure on the soldering point then having to be exerted in another suitable manner.

Of course, such a contact zone may, unlike in the present simplified representation, have practically any number of pairs of contact and connection faces.

Figure 4:
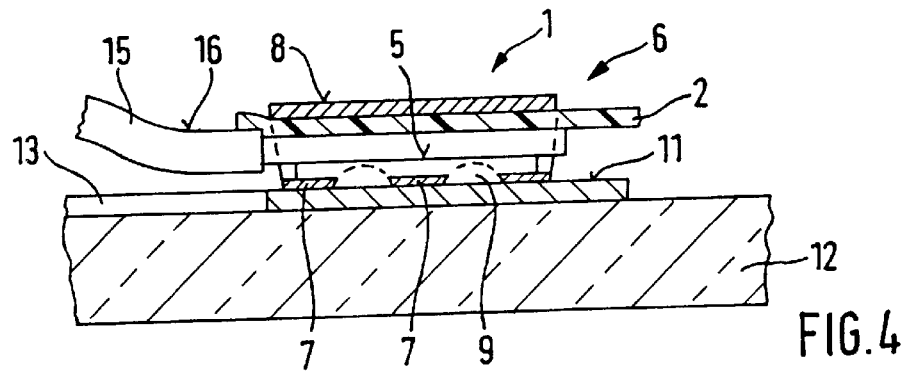
FIG. 4 is a cross-sectional representation of a variant, similar to FIG. 3, in which the conductor is in the form of a cable stripped at the end and is joined to the support sheet and to the solder deposit by means of the insertion piece.

FIG. 4 shows, on an even larger scale, a variant of the connection element, which comprises a cable 15 stripped at the end as electrical conductor. Unlike FIG. 3, the cross section is made here in the longitudinal direction of the conductor. The support sheet 2 may have only a single layer in the connection zone for the cable 15, as shown, or it may correspond to the embodiment according to the other figures. In this variant, the end of the cable 15 stripped of its insulation 16 must be regarded as the contact face 5 of the conductor. The stripped end of the cable is mechanically joined to the support sheet 2 and to the associated solder deposit 9 by means of the insertion piece 6, which is made according to FIGS. 1 to 3. This view, which is rotated through 90° with respect to that in FIG. 3, shows how the teeth 7 of the insertion piece 6 have plastically deformed the solder deposit, again consisting of a portion of a solder wire. When the solder deposit 9 is melted, its material will securely connect the connection face 11 to the contact face 5, as in FIG. 3.

Finally, it should also be explicitly pointed out that the solder deposit could also, unlike in the representations illustrated here, be, if necessary, formed on the rear, that is to say on the core 8, of the insertion pieces 6 if a reliable electrical connection may at the same time be guaranteed between the electrical conductor and the insertion piece. Of course, the latter could also be crimped between the core and the support sheet. Again in this variant, if the solder deposit is only mechanically fastened between the support sheet 2 and the core 8 it is, of course, necessary to provide, in the latter, cavities through which the molten solder can flow towards the connection face.

I claim:

1. A solderable electrical connection element, comprising a thin support sheet (2) and at least one metal conductor (3; 15) having at least one contact face (5) which is provided with a solder deposit (9) and which is joined by soldering this solder deposit to a connection face (11) of another component (12, 13) with which it is associated, and a detachable insertion piece (6) passing through the support sheet 2 and securely joined to the support sheet (2) in the region of the contact face (5).

2. The connection element according to claim 1, wherein the conductor has the shape of a conducting track (3) joined flat to the support sheet (2).

3. The connection element according to claim 1, wherein the conductor has the shape of a cable (15) joined to the support sheet (2).

4. The connection element according claim 1, wherein the solder deposit (9) is produced by a quantity of solder soldered to the insertion piece (6).

5. The connection element according to claim 1, wherein the solder deposit (9, 10) is mechanically fastened to the support sheet (2) by means of the insertion piece (6).

6. The connection element according to claim 1, wherein the solder deposit (9) is soldered directly to the contact face (5) of the conductor (3; 15).

7. The connection element according to claim 1, wherein the insertion piece (6) has, before it is joined to the support sheet 2, an approximately U-shaped cross section with a core (8) and branches having toothed free ends, the toothed free ends of which are pressed through the support sheet 2 and then turned up laterally.

8. The connection element according to claim 7, wherein the solder deposit (9) is formed by jamming a first end of a length of a soft solder wire (10) between, on the one hand, the teeth (7) of the insertion piece (6) and, on the other hand, the support sheet (2) or the contact face (5).

9. The connection element according to claim 7, wherein the solder deposit is formed by jamming a length of a soft solder wire between, on the one hand, the core of the insertion piece and, on the other hand, the support sheet (2) or the contact face (5).

10. The connection element according to claim 1, wherein a contact zone (4) comprising the contact face (5) is provided with an adhesive portion.

11. The connection element according to claim 1, wherein the insertion piece (6) comprises metal sized and positioned to conduct heat through the support sheet (2) or the contact face (5) to the solder deposit (9).

12. A window pane (12) having a first surface wherein the window pane is provided on at least the first surface with a connection face (11) for electrical elements, and at least one solderable connection element according to claim 1 which is soldered to the connection face (11) with the aid of the solder deposit (9) disposed between the contact face (5) and the connection face (11).

13. The window pane according to claim 12, wherein an adhesive is disposed between a contact zone (4) comprising at least part of the contact face (5) and the first surface to form an adhesively bonded joint between the connection element and the first surface of the window pane (12).

14. The window pane according to claim 12, further comprising at least a second window pane spaced in close relation to the window pane to form a laminated pane unit, wherein the first surface of the window pane forms an inner face of the laminated pane unit.

15. A solderable electrical connection element, comprising a thin support sheet (2) and at least one metal conductor (3; 15) having at least one contact face (5) which is provided with a solder deposit (9) and which is joined by soldering this solder deposit to a connection face (11) of another component (12, 13) with which it is associated, and an insertion piece (6) provided with the solder deposit (9) passing through and securely joined to the support sheet (2) in the region of the contact face (5).

16. A solderable electrical connection assembly, comprising a thin support sheet (2), a metal conductor (3; 15) having a contact face (5), an insertion piece (6) adapted to be assembled by inserting the insertion piece through the support sheet (2) in the region of the contact face (5), wherein the insertion piece (6) has a core (8) and at least two spaced apart extending legs, each terminating in a tip, wherein the insertion piece has a dis-assembled first position wherein the tips are spaced apart a predetermined distance and an assembled second position wherein the tips are turned upward in a direction toward one another, and a solder deposit between the core (8) of the insertion piece and the support sheet or the contact, wherein the solderable electrical connection element is adapted to be joined by soldering the solder deposit to a connection face (11) of another component (12, 13) with which it is associated.

17. The connection assembly of claim 16, wherein the turned-up portion is disposed a predetermined height above the contact face, providing a space substantially bounded by the contact face, the legs of the insertion piece, and the turned-up teeth, and wherein the space is adapted such that soldering the solder deposit to a connection face (11) of another component (12, 13) does not result in lateral expulsion of the solder material.

18. The solderable electrical connection assembly of claim 16, wherein the solder wire is disposed between the core (8) of the insertion piece and the support sheet, and further comprising means to allow the solder to flow to the connection face.

19. A solderable electrical connection assembly, comprising a thin support sheet (2) and at least one metal conductor (3; 15) having at least one contact face (5) which is provided with a solder deposit (9) and which can be joined by soldering this solder deposit to a connection face (11) of another component (12, 13) with which it is associated, characterized in that a detachable insertion piece (6) provided with the solder deposit (9) and passing through the support sheet (2) is securely joined to the support sheet (2) in the region of the contact face (5).

* * * * *

UNITED STATES PATENT AND TRADEMARK OFFICE
CERTIFICATE OF CORRECTION

PATENT NO.    : 6,461,188 B2
DATED         : October 8, 2002
INVENTOR(S)   : Reul It is certified that error appears in the above-identified patent and that said Letters Patent is hereby corrected as shown below:

<u>Title page,</u>
Item [75], Inventor, delete "Allemagne" and replace it with -- Herzogenrath --; and Item [56], FOREIGN PATENT DOCUMENTS, delete "4304786" and replace with -- 4304788 --.

Signed and Sealed this

Seventeenth Day of December, 2002

JAMES E. ROGAN
*Director of the United States Patent and Trademark Office*